US010141834B2

United States Patent
Nakamori (10) Patent No.: US 10,141,834 B2
(45) Date of Patent: Nov. 27, 2018

(54) MULTI-PHASE POWER CONVERSION DEVICE CONTROL CIRCUIT

(71) Applicant: FUJI ELECTRIC CO., LTD., Kawasaki-shi, Kanagawa (JP)

(72) Inventor: Akira Nakamori, Matsumoto (JP)

(73) Assignee: FUJI ELECTRIC CO., LTD, Kawasaki (JP)

( * ) Notice: Subject to any disclaimer, the term of this patent is extended or adjusted under 35 U.S.C. 154(b) by 0 days.

(21) Appl. No.: 15/689,790

(22) Filed: Aug. 29, 2017

(65) Prior Publication Data

US 2017/0358982 A1     Dec. 14, 2017

Related U.S. Application Data

(63) Continuation of application No. PCT/JP2016/072424, filed on Jul. 29, 2016.

(30) Foreign Application Priority Data

Sep. 30, 2015   (JP) ................................. 2015-193029

(51) Int. Cl.
*H02M 1/32* (2007.01)
*H02M 1/08* (2006.01)
(Continued)

(52) U.S. Cl.
CPC ............... *H02M 1/32* (2013.01); *H02M 1/08* (2013.01); *H02M 7/539* (2013.01);
(Continued)

(58) Field of Classification Search
CPC ............ H02M 1/00; H02M 1/08; H02M 1/32; H02M 7/48; H02M 7/539; H02K 17/08
(Continued)

(56) References Cited

U.S. PATENT DOCUMENTS 3,456,176 A * 7/1969 Wilkerson .......... H02M 7/1623
388/804
5,235,504 A * 8/1993 Sood ................... H02M 1/4208
323/224
(Continued)

FOREIGN PATENT DOCUMENTS

JP    2001-345688    12/2001
JP    2010-62860      3/2010
(Continued)

OTHER PUBLICATIONS

International Search Report dated Aug. 23, 2016 in corresponding International Patent Application No. PCT/JP2016/072424.
(Continued)

*Primary Examiner* — Yemane Mehari (57) ABSTRACT

To provide a multi-phase power conversion device control circuit capable of preventing switching elements and driver circuits of a multi-phase power conversion device from being damaged even when arm short circuits have occurred to a plurality of phases simultaneously. The control circuit includes: a current detection unit configured to detect a current flowing through the switching element as a voltage value; an overcurrent detection unit configured to, when a voltage value detected by the current detection unit is higher than a first reference voltage, output an individual overcurrent detection signal Scu; and an overcurrent state control unit configured to, when overcurrent state is detected at the current detection unit of each of two or more phases, output a multi-phase overcurrent signal and short-circuit the control terminal of the switching element to an emitter terminal thereof.

10 Claims, 5 Drawing Sheets

(51) Int. Cl.
*H02M 7/539* (2006.01)
*H02M 7/5387* (2007.01)
*H03K 17/082* (2006.01)
*H03K 17/16* (2006.01)

(52) U.S. Cl.
CPC .... *H02M 7/53875* (2013.01); *H03K 17/0828* (2013.01); *H03K 17/168* (2013.01)

(58) Field of Classification Search
USPC .................. 363/53–55, 56.01–56.12, 57–60
See application file for complete search history.

(56) References Cited

U.S. PATENT DOCUMENTS

| | | | | |
|---|---|---|---|---|
| 5,608,301 A | * | 3/1997 | Inaniwa .............. | H02M 5/4585 318/376 |
| 5,731,681 A | * | 3/1998 | Inaniwa .............. | H02M 5/4585 318/376 |
| 6,717,785 B2 | | 4/2004 | Fukuda et al. | |
| 2001/0026429 A1 | | 10/2001 | Fukuda et al. | |

FOREIGN PATENT DOCUMENTS

| | | |
|---|---|---|
| JP | 2013-214875 | 10/2013 |
| JP | 2014-11701 | 1/2014 |

OTHER PUBLICATIONS

International Preliminary Report on Patentability dated Apr. 12, 2018 in corresponding International Patent Application No. PCT/JP2016/072424.

\* cited by examiner

MULTI-PHASE POWER CONVERSION DEVICE CONTROL CIRCUIT

CROSS-REFERENCE TO RELATED APPLICATIONS

This application is a continuation application, under 35 U.S.C. § 111(a), of International Patent Application No. PCT/JP2016/072424, filed Jul. 29, 2016, which claims the foreign priority benefit under 35 U.S.C. § 119 of Japanese Patent Application No. 2015-193029, filed Sep. 30, 2015, the entire contents of which are incorporated herein by reference.

TECHNICAL FIELD

The present invention relates to a multi-phase power conversion device control circuit that, in a multi-phase power conversion device, protects switching elements and the like at an occurrence of an overcurrent state.

BACKGROUND ART

In a conventional control circuit in a multi-phase power conversion device that outputs, for example, three-phase power, a method has been used in which, when, for example, an overcurrent state is detected in any one phase of the three phases, supply of a source current to a control terminal of a switching element for the one phase is stopped and, in conjunction therewith, voltage at the control terminal of the switching element is stabilized in accordance with a prescribed reference voltage (see, for example, PTL 1).

The conventional technique is configured to make an operational amplifier operate using an overcurrent detection signal that has detected an overcurrent state, to make the operational amplifier compare a divided voltage into which an output voltage that is to be output to the control terminal of the switching element is divided with the reference voltage, and to control the output voltage in such a way that the divided voltage coincides with the reference voltage.

CITATION LIST

Patent Literature

PTL 1: JP 2010-62860 A (FIG. 6)

SUMMARY OF INVENTION

Technical Problem

However, in the conventional technique, even when an overcurrent state is detected, the output voltage, which is supplied to the control terminal of the switching element, is controlled in such a way that the divided voltage coincides with the reference voltage, which causes the switching element to be kept in the ON state.

For this reason, in order to bring the switching element to the OFF state, connecting another switch element between the control terminal of the switching element and a low potential side terminal, and, by controlling the switch element to the ON state by means of a delayed overcurrent detection signal that is delayed for a prescribed period of time by a delay circuit, short-circuiting the control terminal of the switching element and the low potential side terminal are conceivable.

In a multi-phase power conversion device, such as a multi-phase inverter and a multi-phase converter, there is, although rarely, a case in which, due to a malfunction caused by noise and the like, arm short circuits occur to a plurality of phases simultaneously, causing an overcurrent state. In such arm short circuits simultaneously occurring in a plurality of phases, several times more overcurrent than an overcurrent in an arm short circuit occurring in only one phase flows. When such a large overcurrent flows, an instantaneous voltage shift occurs across a reactance portion, such as a wire bonding portion, due to a temporal change in the current. As the voltage shift serves as a trigger, a vibration occurs in a closed loop in the circuit.

Figure 3A:
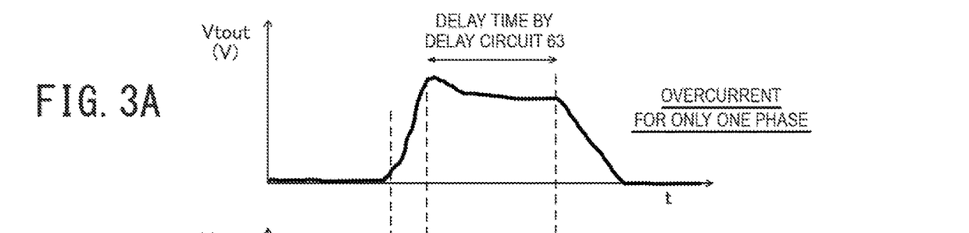
FIGS. 3A to 3C are diagrams illustrative of waveforms of a signal Vtout that is output from a switching element driver circuit.
Figure 3B:
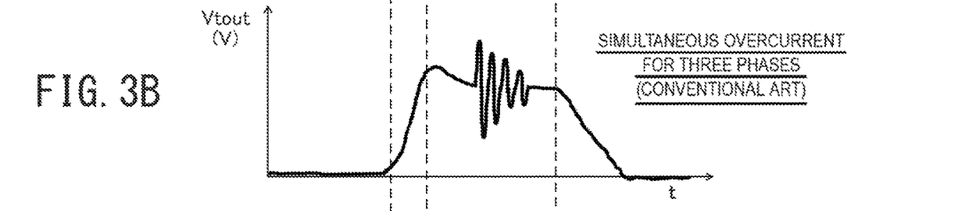

When, because of arm short circuits occurring in a plurality of phases simultaneously, an oscillation phenomenon involving a large amplitude occurs during a delay time set by a delay circuit, that is, during a period of time in which an output voltage is controlled to a set voltage by an operational amplifier, as illustrated by a curve for a duration from t1 to t2 in FIG. 3B, and a breakdown voltage of IGBTs as switching elements of a multi-phase power conversion device is exceeded within a duration starting from the arm short circuit occurrence until the end of the above-described delay time set by the delay circuit, the IGBTs and driver circuits thereof are sometimes damaged.

The problem to be solved by the present invention is to prevent switching elements and driver circuits of a multi-phase power conversion device from being damaged even when arm short circuits have occurred to a plurality of phases simultaneously as described above.

Solution to Problem

According to an aspect of the present invention, there is provided a multi-phase power conversion device control circuit, including switching element driver circuits configured to respectively drive switching elements that are disposed for multiple phases, respectively, each of the switching element driver circuits including: a driving current supply circuit configured to, when the corresponding switching element is brought to an operating state, supply a control terminal of the switching element with a source current and, when the switching element is brought to a non-operating state, supply the control terminal with a sink current; a current detection unit configured to detect a current flowing through the switching element as a voltage value; an overcurrent detection unit configured to, when a voltage value detected by the current detection unit is higher than a first reference voltage, output an individual overcurrent detection signal; and an overcurrent state control unit configured to, when the overcurrent detection units in the switching element driver circuits of at least two or more phases output the individual overcurrent detection signals, output a multi-phase overcurrent signal and short-circuit the control terminal of the switching element to a low potential side terminal.

Advantageous Effects of Invention

According to the present invention, since, when arm short circuits have occurred to multiple phases simultaneously, such as two phases simultaneously and three phases simultaneously, an operation for short circuit protection is performed without waiting for the elapse of a prescribed period of time after detection of the arm short circuits, switching elements and driver circuits may be prevented from being damaged.

DESCRIPTION OF EMBODIMENTS

Embodiments of the present invention will now be described with reference to the drawings. In the following description of the drawings, the same or similar reference signs are assigned to the same or similar portions.

The following embodiments indicate devices and methods to embody the technical idea of the present invention byway of examples, and the technical idea of the present invention does not limit the materials, shapes, structures, arrangements, and the like of the constituent elements to those described below. The technical idea of the present invention can be subjected to a variety of alterations within the technical scope prescribed by the claims described in CLAIMS.

Hereinafter, a driver device of semiconductor elements according to one embodiment of the present invention will be described with reference to the drawings.

Figure 1:
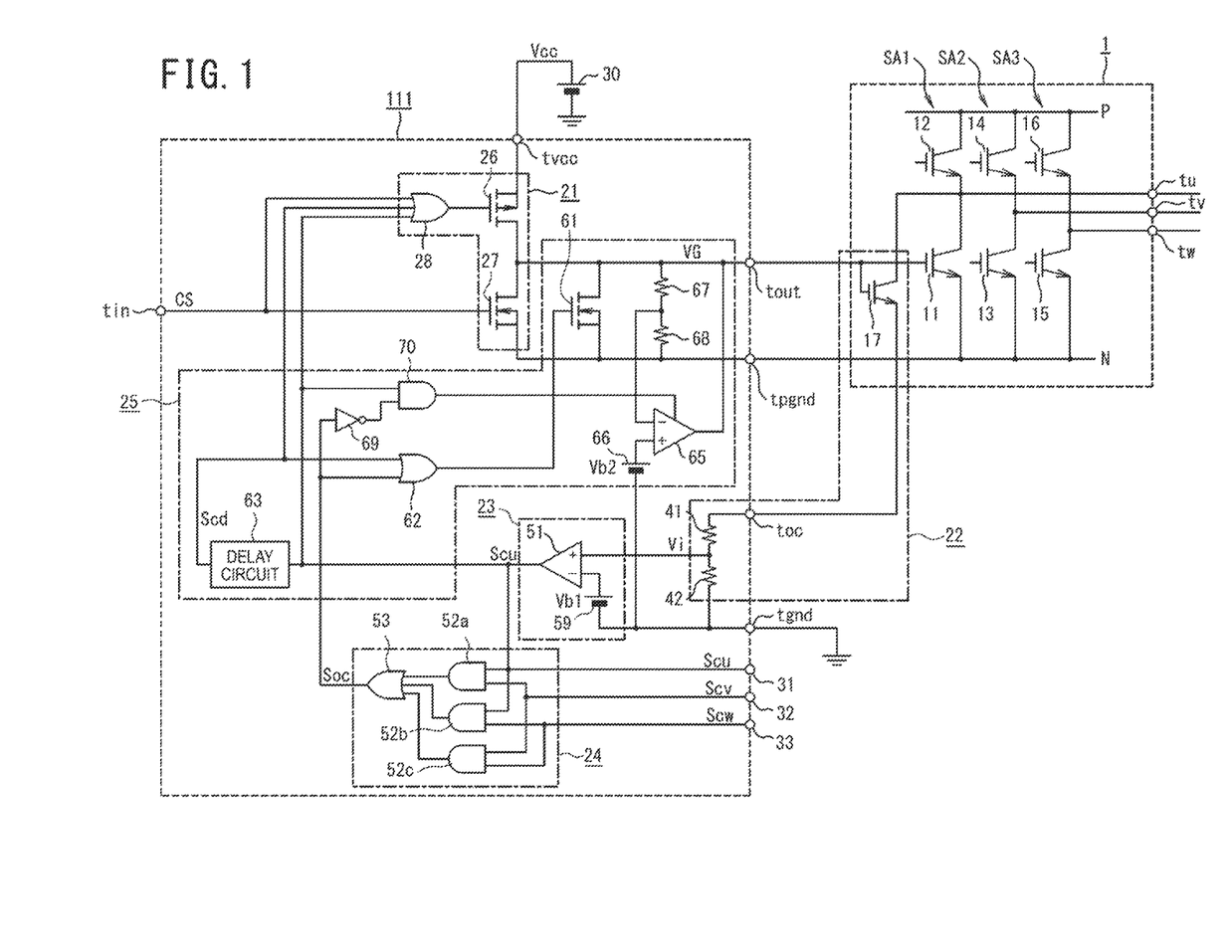
FIG. 1 is a diagram illustrative of a first embodiment of a power conversion device and a control circuit thereof according to the present invention.

In FIG. 1, reference sign 1 indicates a three-phase inverter device as a multi-phase power conversion device. The three-phase inverter device 1 has three switching arms SA1 to SA3 connected in parallel between a positive polarity line P and a negative polarity line N that are connected to a DC (direct current) voltage source (not illustrated).

The switching arm SA1 has an IGBT 11 (X-phase) and an IGBT 12 (U-phase) serving as switching elements connected in series between the negative polarity line N and the positive polarity line P, and an AC (alternating current) output terminal tu is led out from a connection point between the IGBT 11 and the IGBT 12.

In addition, the switching arm SA2 has an IGBT 13 (Y-phase) and an IGBT 14 (V-phase) serving as switching elements connected in series between the negative polarity line N and the positive polarity line P, and an AC output terminal tv is led out from a connection point between the IGBT 13 and the IGBT 14.

Furthermore, the switching arm SA3 has an IGBT 15 (Z-phase) and an IGBT 16 (W-phase) serving as switching elements connected in series between the negative polarity line N and the positive polarity line P, and an AC output terminal tw is led out from a connection point between the IGBT 15 and the IGBT 16.

A three-phase load, such as a three-phase AC motor, is connected to the respective AC output terminals tu, tv, and tw.

Although not illustrated completely, each of the IGBTs 11 to 16 included in the three-phase inverter device 1 is, as illustrated represented by the IGBT 11, provided with a current detecting IGBT 17 the collector and gate of which are connected to the collector and gate, respectively, of the IGBT 11.

A gate voltage VG of each of the IGBTs 11 to 16 included in the three-phase inverter device 1 is, as illustrated represented by the IGBT 11, controlled by a driver circuit 111 serving as a switching element driver circuit. Although driving six IGBTs requires a driver circuit for each IGBT, only the driver circuit 111, representing the driver circuits, that drives the IGBT 11 of the X-phase is illustrated in FIG. 1.

The driver circuit 111 includes a control signal input terminal tin to which an ON-OFF control signal CS that ON-OFF controls the IGBT 11 in the three-phase inverter device 1 is input, a DC control power source terminal tvcc to which a DC voltage Vcc from a DC control voltage source 30 is input, an output terminal tout that is connected to the gate of the IGBT 11 in the inverter device 1, a first ground terminal tpgnd that is connected to the negative polarity line N in the inverter device 1, a detected current input terminal toc to which the emitter of the current detecting IGBT 17 in the inverter device 1 is connected, and a second ground terminal tgnd that is connected to an external ground (not illustrated).

In addition, the driver circuit 111 includes a driving current supply circuit 21, a current detection unit 22, an overcurrent detection unit 23, a multi-phase overcurrent state detection unit 24, and an overcurrent state control unit 25.

The driving current supply circuit 21 includes a P-channel field effect transistor 26 and an N-channel field effect transistor 27 that are connected in series between a DC control voltage terminal tvcc and the first ground terminal tpgnd, the P-channel field effect transistor 26 serving as a first switching element and controlling a source current, the N-channel field effect transistor 27 serving as a second switching element and controlling a sink current.

The source, drain, and gate of the P-channel field effect transistor 26 are connected to the DC control power source terminal tvcc, the drain of the N-channel field effect transistor 27, and an OR circuit 28, respectively. To the OR circuit 28, an individual overcurrent detection signal Scu from the overcurrent detection unit 23, which will be described later, a delayed overcurrent detection signal Scd from a delay circuit 63, and a control signal CS that is input to the control signal input terminal tin are input.

The drain, source, and gate of the N-channel field effect transistor 27 are connected to the source of the P-channel field effect transistor 26, the first ground terminal tpgnd, and the input terminal tin, respectively.

A connection point between the P-channel field effect transistor 26 and the N-channel field effect transistor 27 is connected to the output terminal tout.

The current detection unit 22 includes resistors 41 and 42 that are connected in series between a current input terminal toc and the second ground terminal tgnd, and a voltage value Vi in accordance with a current value flowing through the collector of the IGBT 11 in the three-phase inverter device 1 is output from a connection point between the resistors 41 and 42.

The overcurrent detection unit 23 includes a comparator 51 to the non-inverting input terminal of which the voltage value Vi, output from the current detection unit 22, is input and to the inverting input terminal of which a first reference voltage Vb1 is input from a first reference voltage source 59. The comparator 51 outputs, as the individual overcurrent detection signal Scu, a comparison signal that is at an L-level when Vi<Vb1 holds and at an H-level when Vi≥Vb1 holds.

The multi-phase overcurrent state detection unit 24 includes an output terminal 31 that outputs the individual overcurrent detection signal Scu input from the overcurrent detection unit 23 to other driver circuits 113 and 115 and input terminals 32 and 33 to which individual overcurrent detection signals Scv and Scw output from overcurrent detection units 23 in the other driver circuits 113 and 115 are input.

The multi-phase overcurrent state detection unit 24 includes three AND circuits 52*a*, 52*b*, and 52*c* and an OR circuit 53 to which outputs from the AND circuits 52*a*, 52*b*, and 52*c* are input. To the AND circuit 52*a*, the individual overcurrent detection signals Scu and Scv are input, and a logical product output thereof is output to the OR circuit 53. To the AND circuit 52*b*, the individual overcurrent detection signals Scu and Scw are input, and a logical product output thereof is output to the OR circuit 53. To the AND circuit 52*c*, the individual overcurrent detection signals Scv and Scw are input, and a logical product output thereof is output to the OR circuit 53. A logical sum output from the OR circuit 53 is output as a multi-phase overcurrent signal Soc.

The overcurrent state control unit 25 includes a short-circuiting switch element 61 that is connected in parallel with the switching element 27 in the driving current supply circuit 21 and an operational amplifier 65 that controls the gate voltage VG at the output terminal tout to a second reference voltage Vb2.

The short-circuiting switch element 61 is configured with, for example, an N-channel field effect transistor. The drain, source, and gate of the N-channel field effect transistor are connected to between a connection point between the field effect transistors 26 and 27 in the driving current supply circuit 21 and the output terminal tout, between the source of the field effect transistor 27 in the driving current supply circuit and the first ground terminal tpgnd, and an OR circuit 62, respectively.

To the OR circuit 62, the multi-phase overcurrent signal Soc, output from the multi-phase overcurrent state detection unit 24, and the delayed overcurrent detection signal Scd, output from the delay circuit 63 that delays the individual overcurrent detection signal Scu from the overcurrent detection unit 23 for a prescribed period, are input. The short-circuiting switch element 61 being brought to the ON state causes a short circuit between the control terminal (gate terminal) and the low potential side terminal (emitter terminal) of the switching element 11.

The non-inverting input terminal, inverting input terminal, and output terminal of the operational amplifier 65 are connected to a second reference voltage source 66 that outputs a second reference voltage Vb2, a connection point between voltage divider resistors 67 and 68 that are connected in parallel with the short-circuiting switch element 61, and the output terminal tout, respectively. Operating power that is supplied to the operational amplifier 65 is supplied from an AND circuit 70 to which the individual overcurrent detection signal Scu, which is output from the overcurrent detection unit 23, is input and the multi-phase overcurrent signal Soc, which is output from the multi-phase overcurrent state detection unit 24, is input via a logic inversion circuit (NOT circuit) 69.

Figure 2:
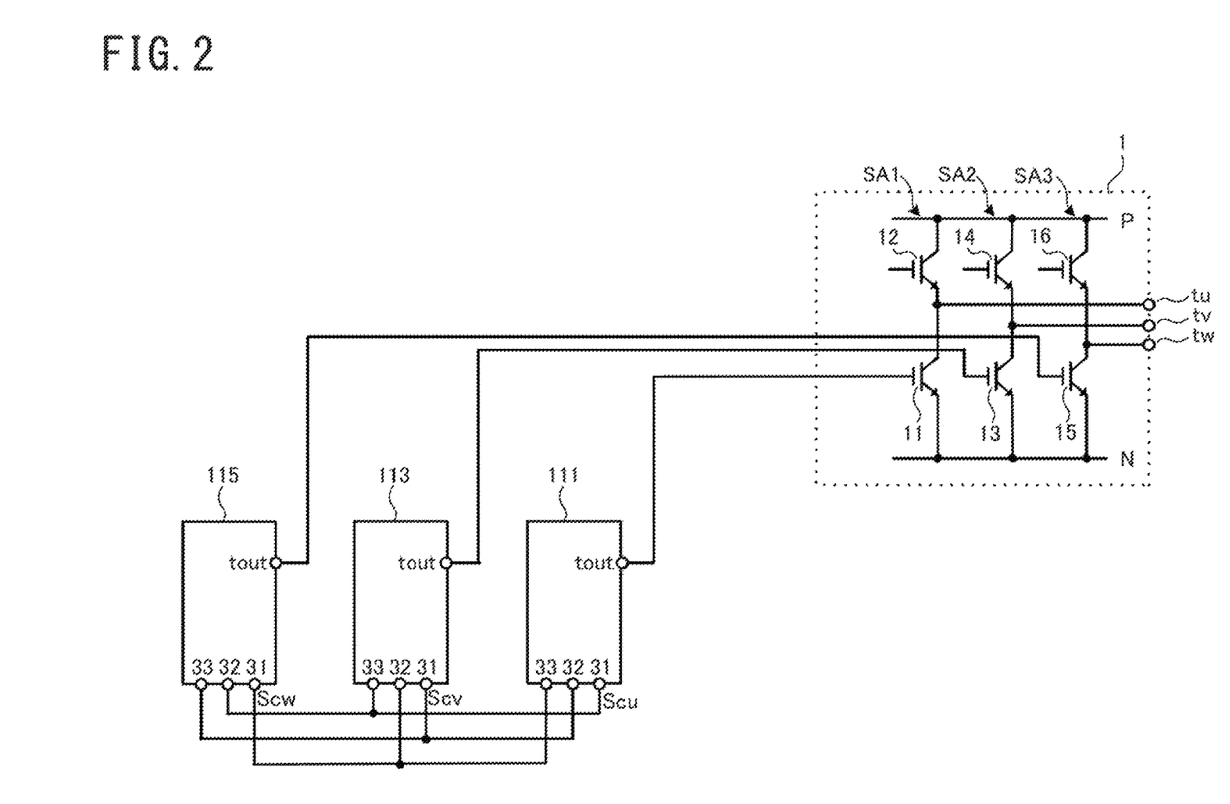
FIG. 2 is a diagram illustrative of a connection method among input/output terminals of the first embodiment.

FIG. 2 is a diagram illustrative of an interconnection method among the driver circuits 111, 113, and 115 with respect to terminals 31, 32, and 33. The driver circuits 111, 113, and 115 are circuits driving the IGBTs 11, 13, and 15, respectively, and the configurations thereof are the same as the configuration of the driver circuit 111 in FIG. 1. As illustrated in FIG. 2, the terminal 31 of one driver circuit is configured to be connected to the terminal 32 or 33 of another driver circuit.

Next, an operation of the above-described first embodiment will be described.

First, an operation in a normal state in which no short circuit between the collector and emitter of the IGBT 11 (arm short circuit) has occurred will be described.

To the terminal tin, the control signal CS for switching on/off the IGBT 11 is input. The control signal CS is a square wave signal that transitions between the input voltage Vcc (hereinafter, also referred to as an H-level) and a ground voltage (hereinafter, also referred to as an L-level) of the driver circuit 111. The voltage at the terminal tin turning to the L-level causes the N-channel field effect transistor 27 to be brought to a non-conductive state.

Since, in the normal operation, when the control signal CS from the terminal tin is at the L-level, the other inputs to the OR circuit 28 are also at the L-level, the gate potential of the P-channel field effect transistor 26 becomes the L-level, which causes the P-channel field effect transistor 26 to be conductive. As a result, a source current charging the gate capacitance of the IGBT 11 is supplied from the DC control voltage source 30 via the P-channel field effect transistor 26 to bring the voltage at the terminal tout to the input voltage Vcc, which causes the IGBT 11 to turn on.

When the voltage of the control signal CS, input to the terminal tin, turns to the H-level, the P-channel field effect transistor 26 is caused to be non-conductive, which causes, instead thereof, the N-channel field effect transistor 27 to be brought to a conductive state. Therefore, a sink current discharging the gate capacitance of the IGBT 11 flows through the N-channel field effect transistor 27 to bring the voltage at the terminal tout to the L-level, which causes the IGBT 11 to turn off. In this manner, by performing control switching the turn-on state and the turn-off state of each of the IGBTs 11 to 16 successively, the inverter device 1 may generate a three-phase AC voltage from a DC voltage between P and N.

Next, when an arm short circuit has occurred to only one phase (the arm short circuit means a short circuit occurring between the collector and emitter of an IGBT, and, in the embodiment, a case is considered in which the IGBT 12, which is connected in series with the IGBT 11, is brought to a short circuit state), a DC high voltage of several hundreds of volt is applied between the collector and emitter of the IGBT 11, and, when the IGBT 11 turns on, a state is reached in which an excessive collector current flows through the IGBT 11.

For this reason, a small current proportional to the collector current flowing through the IGBT 11 flows through the current detecting IGBT 17, which detects a collector current flowing through the IGBT 11, and the current flows to the resistors 41 and 42 via the terminal toc to cause the end-to-end voltage Vi of the resistor 42 to increase. The larger is the collector current flowing through the IGBT 11, the higher the end-to-end voltage Vi of the resistor 42 becomes in proportion thereto. When the end-to-end voltage Vi of the resistor 42 increases to the first reference voltage Vb1 or higher, the individual overcurrent detection signal Scu, which is output from the comparator 51 in the overcurrent detection unit 23, is inverted from the L-level to the H-level.

The individual overcurrent detection signal Scu, which has been inverted to the H-level, is supplied to the gate of the P-channel field effect transistor 26 via the OR circuit 28 to cause the P-channel field effect transistor 26 to be non-conductive.

When only the driver circuit 111 corresponding to one phase has detected an arm short circuit, the other driver circuits 113 and 115 have not detected an overcurrent by means of the overcurrent detection units 23, and the individual overcurrent detection signals Scv and Scw, which are input to the input terminals 32 and 33, respectively, are at the L-level.

For this reason, logical product outputs output from the respective AND circuits 52*a*, 52*b*, and 52*c* are the L-level, and the multi-phase overcurrent signal Soc, which is output from the OR circuit 53, is kept at the L-level. The multi-phase overcurrent signal Soc is logically inverted by the logic inversion circuit 69.

Therefore, since the individual overcurrent detection signal at the H-level and a signal at the H-level to which the multi-phase overcurrent signal Soc is inverted are input to the input side of the AND circuit 70, the output therefrom becomes the H-level to cause operating power to be supplied to the operational amplifier 65. As a result, the gate voltage VG, which is an output voltage from the driver circuit 111, is controlled in such a way that a divided voltage by the voltage divider resistors 67 and 68 is equal to the second reference voltage Vb2. With the above operation, controlling a voltage Vtout to a fixed value lower than the voltage Vcc at the terminal tvcc to limit a current flowing through the IGBT 11 to a fixed value prevents device destruction from occurring in the IGBT 11.

The individual overcurrent detection signal Scu from the overcurrent detection unit 23 is also input to the delay circuit 63. Thus, after a period of time not shorter than a preset duration has elapsed in the delay circuit 63, the delayed overcurrent detection signal Scd at the H-level is output from the delay circuit 63 and is supplied to the gate of the P-channel field effect transistor 26 via the OR circuit 28, which causes the P-channel field effect transistor 26 to be kept non-conductive. At the same time, the delayed overcurrent detection signal Scd is supplied to the gate of the short-circuiting switch element 61 via the OR circuit 62, which causes the short-circuiting switch element 61 to be controlled to the ON state. For this reason, the voltage at the terminal tout is lowered to a ground level. Therefore, the gate and emitter of the IGBT 11 are short circuited.

Figure 3C:
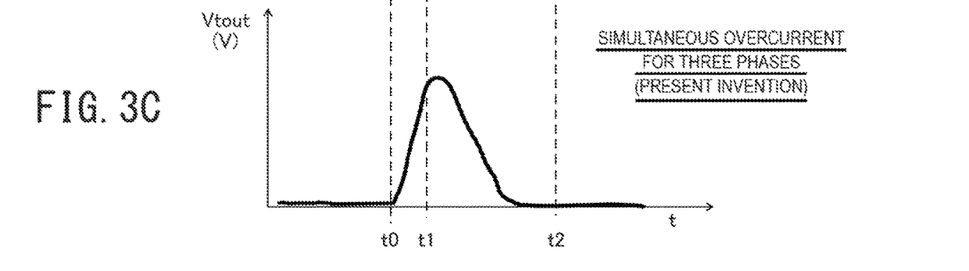

FIGS. 3A to 3C illustrate waveforms of the voltage Vtout at the terminal tout. FIG. 3A illustrates a waveform in a case of one arm short circuit (overcurrent with respect to only one phase). Times t0, t1, and t2 are a time at which Vtin steps down, a time at which the voltage value Vi becomes not lower than the voltage value Vb1 and an overcurrent is detected, and a time delayed by delay time Δt that is set in the delay circuit 63 from time t1 (t2=t1+Δt), respectively. As illustrated in the drawing, when an overcurrent is detected, the voltage Vtout is controlled to a fixed voltage by the operational amplifier 65, and, after a period of time set in the delay circuit 63 has passed thereafter, the voltage Vtout decreases gradually.

Next, an operation when overcurrents have occurred to two or more phases simultaneously will be described using FIG. 1, FIG. 2, and FIGS. 3A to 3C. In FIGS. 1 and 2, when IGBTs corresponding to any two phases among the three phases, for example, the IGBT 11 and the IGBT 13, are brought to an overcurrent state simultaneously due to some reason, the individual overcurrent detection signals Scu and Scv are output to the terminals 31 of the respective driver circuits 111 and 113 from the corresponding overcurrent detection units 23.

In this case, the individual overcurrent detection signal Scu being fed to the terminal 31 of the driver circuit 111 causes the individual overcurrent detection signal Scu generated in the driver circuit 111 to be also output to the terminal 32 of the driver circuit 113 and the terminal 33 of the driver circuit 115, which are connected to the terminal 31 of the driver circuit 111. In a similar manner, the individual overcurrent detection signal Scv being fed to the terminal 31 of the driver circuit 113 causes the individual overcurrent detection signal Scv generated in the driver circuit 113 to be also output to the terminal 33 of the driver circuit 111 and the terminal 32 of the driver circuit 115, which are connected to the terminal 31 of the driver circuit 113. For this reason, the individual overcurrent detection signals at the H-level are given to the terminals 31 and 32 of the driver circuit 111, to the terminals 31 and 33 of the driver circuit 113, and to the terminals 32 and 33 of the driver circuit 115, respectively.

Then, since the AND circuit 52*a*, the AND circuit 52*b*, and the AND circuit 52*c* output the H-level in the driver circuit 111, the driver circuit 113, and the driver circuit 115, respectively, the OR circuits 53 in the respective driver circuits also output the H-level, that is, the multi-phase overcurrent signals Soc. When the outputs from the OR circuits 53 turn to the H-level, the outputs from the OR circuits 62 also turn to the H-level immediately, which causes the N-channel field effect transistors 61 to become conductive promptly. The waveform of Vtout in this case is illustrated in FIG. 3C. Compared with a case in which an arm short circuit occurring in only one phase causes the N-channel field effect transistor 61 to turn on only after a preset period of time has passed in a delay circuit 54, it becomes possible to halt the IGBTs of all the three phases instantly, which enables destruction of the IGBTs due to overcurrents to be prevented.

When the outputs from the OR circuits 53 turn to the H-level, the outputs from the logic inversion circuits 69 turn to the L-level, which cause the operational amplifiers 65 to be brought to a non-operating state. When an arm short circuit occurs in only one phase, an IGBT corresponding to the one phase, for example, the IGBT 11, is brought to an overcurrent state, and the individual overcurrent detection signal Scu is output to the terminal 31 of the driver circuit 111 from the comparator 51.

In this case, only the individual overcurrent detection signal Scu is given to the terminal 33 of the driver circuit 113 and the terminal 32 of the driver circuit 115, and no individual overcurrent detection signal is given to the terminals 32 and 33 of the driver circuit 111, the terminals 31 and 32 of the driver circuit 113, and the terminals 31 and 33 of the driver circuit 115. Thus, all the outputs from the AND circuits 52*a*, 52*b*, and 52*c* in the driver circuits 111, 113, and 115 become the L-level, which causes outputs from the OR circuits 53, that is, the multi-phase overcurrent signals Soc, to be kept at the L-level. In this case, the behavior follows a curve for a duration from t1 to t2 illustrated in FIG. 3A.

Furthermore, when arm short circuits have occurred to the switching arms SA to SC corresponding to all the three phases simultaneously, the H-levels are output from three AND circuits 52*a* to 52*c* simultaneously and the output H-levels are input to the OR circuit 53 to be output as the multi-phase overcurrent signal Soc in each of the multi-phase overcurrent detection units 24 in the respective driver circuits 111, 113, and 115, which, in a similar manner to the above-described case in which arm short circuits have occurred to two phases simultaneously, causes the IGBTs 11, 13, and 15 to be immediately turned off simultaneously in the respective driver circuits 111, 113, and 115 and enables destruction of the IGBTs due to overcurrents to be prevented.

In the present embodiment, as described above, when arm short circuits have occurred in a plurality of phases simultaneously, the IGBTs corresponding to all the three phases may be halted promptly, and it may become possible to prevent the IGBTs and driver circuits thereof from being destructed by voltage across the IGBTs exceeding a breakdown voltage due to an oscillation phenomenon caused by the situation of arm short circuits occurring to a plurality of phases simultaneously.

Figure 4:
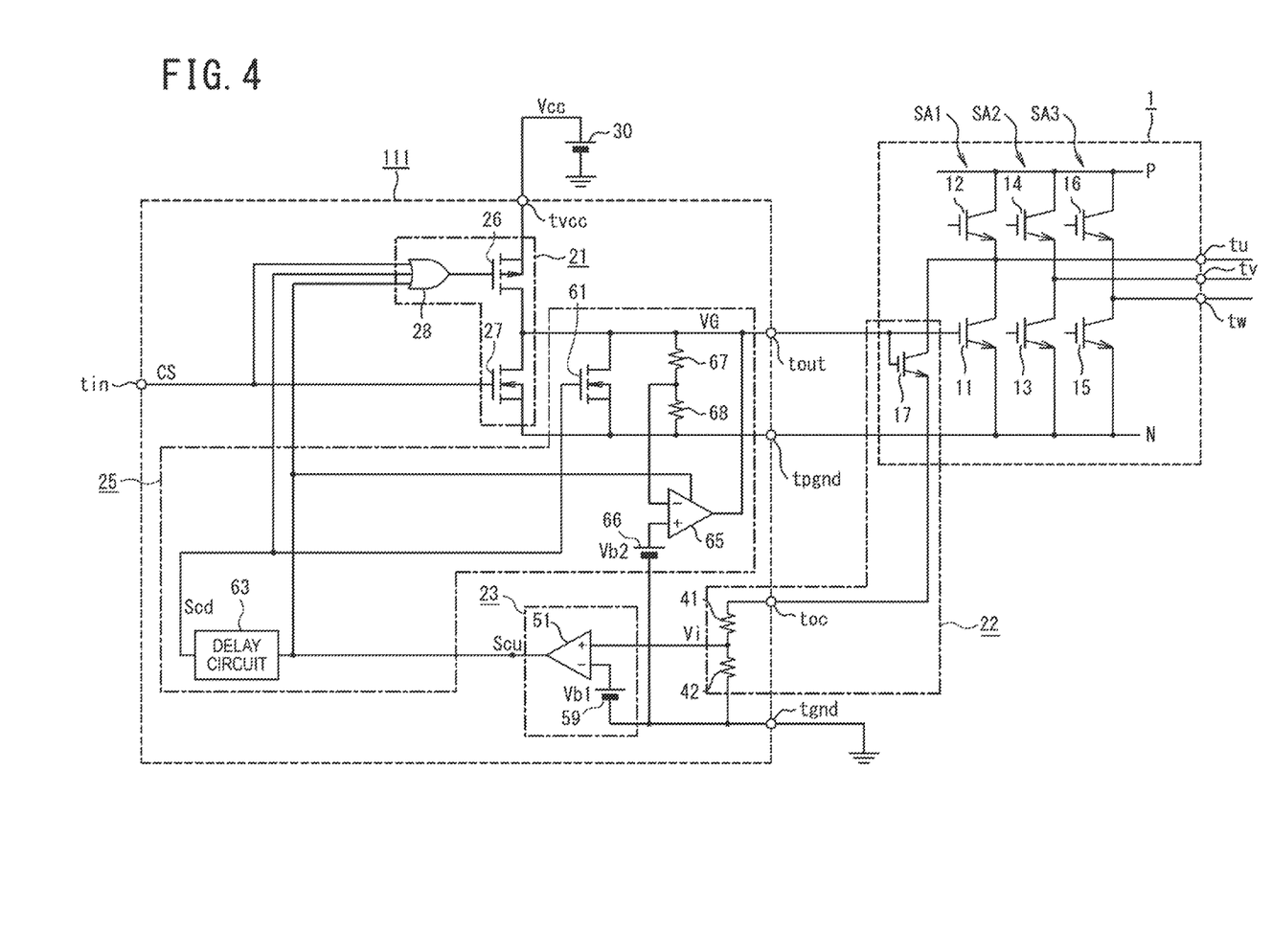
FIG. 4 is a diagram illustrative of a power conversion device and a control circuit thereof from which a multi-phase overcurrent detection unit of the first embodiment is omitted.

That is, when the multi-phase overcurrent detection unit 24 in the present embodiment is omitted, the individual overcurrent detection signal Scu, output from the overcurrent detection unit 23, is supplied to the gate of the P-channel field effect transistor 26 via the OR circuit 28 and, in conjunction therewith, is supplied to the operational amplifier 65 as an operating power source, and, furthermore, is supplied to the delay circuit 63, as illustrated in FIG. 4. The delayed overcurrent detection signal Scd, output from the delay circuit 63, is supplied to the OR circuit 28 and, in conjunction therewith, is supplied to the gate of the short-circuiting switch element 61.

Since the configuration illustrated in FIG. 4 is a configuration in which the driver circuits corresponding to the respective phases are halted separately, even when IGBTs corresponding to a plurality of phases are brought to an overcurrent state simultaneously, the overcurrent state control units 25 of the respective phases operate and the driver circuit 111 and the IGBT 11 come to halt after having been delayed for a preset period of time by the delay circuits 63.

Therefore, when, for example, an arm short circuit has occurred to only the switching arm SA, which is made up of the IGBTs 11 and 12, an overcurrent is detected by the comparator 51 in the overcurrent detection unit 23 and the individual overcurrent detection signal Scu at the H-level is output. Thus, the individual overcurrent detection signal Scu causes the P-channel field effect transistor 26 to be brought to a non-conductive state and, in conjunction therewith, the operational amplifier 65 is supplied with operating power to be brought to an operating state. Subsequently, after a delay time Δt set by the delay circuit 63 has passed, the short-circuiting switch element 61 is controlled to a conductive state and the gate and emitter of the IGBT 11 are short circuited, which causes the IGBT 11 to turn off.

On the other hand, when, for example, arm short circuits have occurred to the switching arms SA and SB simultaneously, the overcurrent detection units 23 in the driver circuits 111 and 113 detect overcurrents separately. Thus, the overcurrent state control units 25 corresponding to the U-phase and the V-phase operate, and the driver circuit 111 and the IGBT 11 come to halt after having been delayed for a period of time set by the delay circuit 63.

In such arm short circuits occurring in a plurality of phases simultaneously, several times more overcurrent than an overcurrent in an arm short circuit occurring in only one phase flows. When such a large overcurrent flows, an instantaneous voltage shift occurs across a reactance portion, such as a wire bonding portion, due to a temporal change in the current. As the voltage shift serves as a trigger, a vibration occurs in a closed loop in the circuit.

When, because of arm short circuits occurring in a plurality of phases simultaneously, an oscillation phenomenon involving a large amplitude occurs during a delay time set by the delay circuit 63, that is, during a period of time in which an output voltage is controlled to a set voltage by an operational amplifier, as illustrated by a curve for a duration from t1 to t2 in FIG. 3B, and a breakdown voltage of IGBTs as switching elements of a multi-phase power conversion device is exceeded within a duration starting from the arm short circuit occurrence until the end of the above-described delay time set by the delay circuit 63, the IGBTs and driver circuits thereof are sometimes damaged.

On the other hand, in the present embodiment, the multi-phase overcurrent state detection units 24 are incorporated in the respective driver circuits 111, 113, and 115, respectively, and, when the multi-phase overcurrent state detection units 24 detect an overcurrent state for a plurality of phases, the multi-phase overcurrent signals Soc are output. Thus, the multi-phase overcurrent signals Soc cause the short-circuiting switch elements 61 to be conductive promptly and the IGBT 11 to be turned off and, in conjunction therewith, supply of operating power to the operational amplifiers 65 is stopped simultaneously in the respective driver circuits 111, 113, and 115. Therefore, the output voltage (gate voltage) Vtout that is output from the output terminal tout of each driver circuit 111 is caused to decrease immediately as illustrated in FIG. 3C, which eliminates the possibility of being influenced by a vibration occurring in a closed loop in the circuit triggered by an instantaneous voltage shift that occurs across a reactance portion, such as a wire bonding portion, due to a temporal change in the current.

Next, a second embodiment of the present invention will be described using FIG. 5.

The second embodiment differs from the first embodiment in that, while, in the first embodiment, a circuit was configured in such a way that, when overcurrents are detected with respect to two or three phases simultaneously, the IGBTs of all the three phases can be turned off immediately, in the second embodiment, a circuit is configured in such a way that, only when overcurrents are detected with respect to all the three phases simultaneously, the IGBTs of all the three phases can be turned off immediately.

Figure 5:
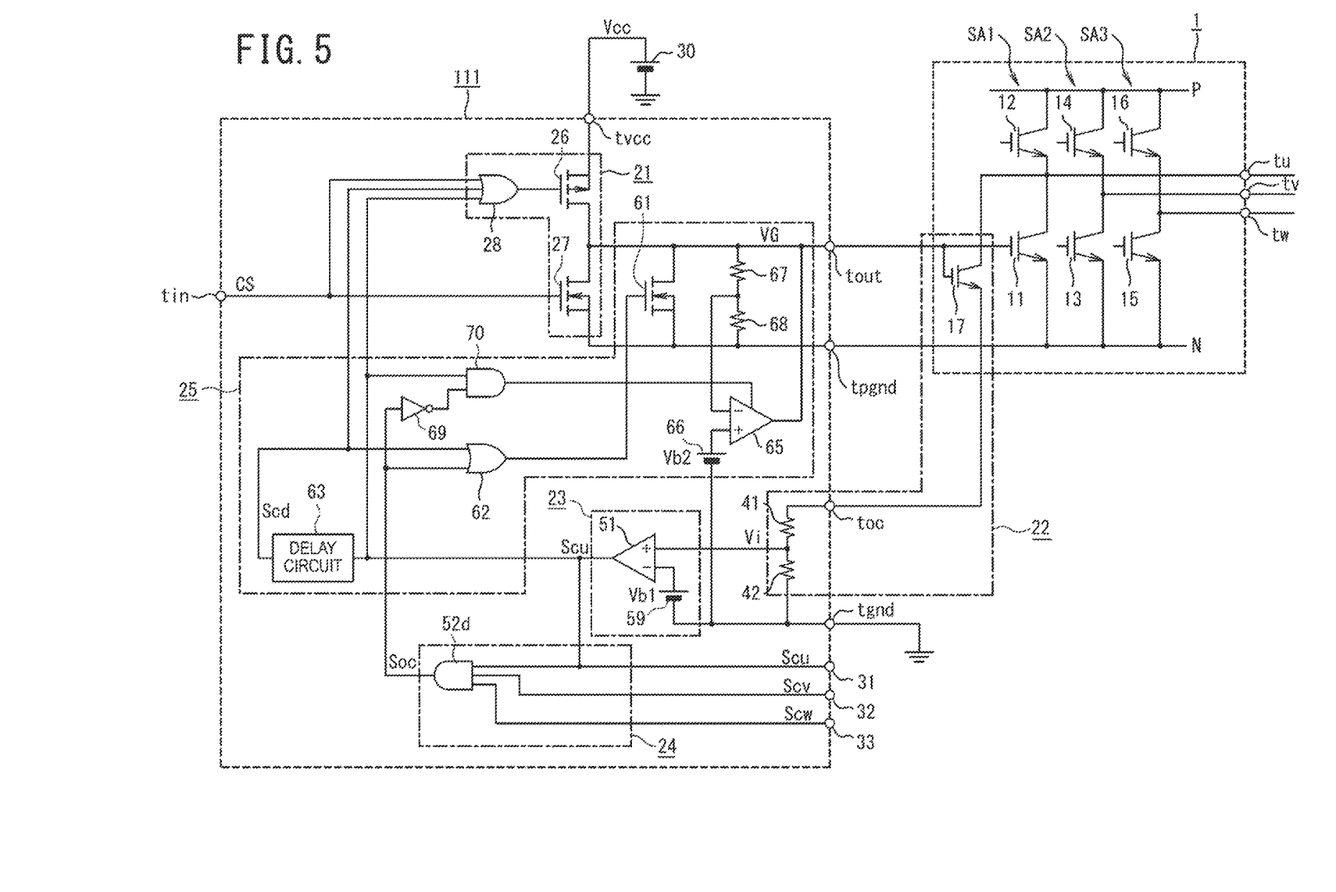
FIG. 5 is a diagram illustrative of a second embodiment of the power conversion device and the control circuit thereof according to the present invention.

In FIG. 5, a multi-phase overcurrent detection unit 24 includes a three-input AND circuit 52d to which signals at terminals 31, 32, and 33 are input as they are. For this reason, to turn a multi-phase overcurrent signal Soc to an H-level, all individual overcurrent detection signals Scu, Scv, and Scw at the output terminals 31, 32, and 33 are required to be switched to the H-level. That is, overcurrent states occur with respect to all the three phases simultaneously, all the individual overcurrent detection signals Scu, Scv, and Scw in driver circuits 111, 113, and 115 being turned to the H-level, and signals at the H-level being input from the terminals 32 and 33, to which individual overcurrent detection signals are given from the other driver circuits, are conditions for detection of overcurrent. The circuit configuration, operation, waveform of Vtout other than the above are the same as in FIG. 1, FIG. 2, and FIG. 3C.

In both the first embodiment and the second embodiment, circuits are configured to perform detection and control of an overcurrent due to an arm short circuit at each of IGBTs of the lower arms (X-phase, Y-phase, and Z-phase). This is because, in the upper arms, separate variations in potentials at the respective grounds make difficult detection and control of a current due to an arm short circuit.

Although, in the above-described first and second embodiments, a case in which switching elements in the inverter device 1 are IGBTs was described, the present invention is not limited to the case, and a voltage controlled semiconductor device, such as a MOSFET, may be applied and, furthermore, a wide band gap semiconductor device, such as an SiC-IGBT, an SiC-MOSFET, a GaN-IGBT, a GaN-MOSFET, may also be applied.

Furthermore, although, in the above-described first and second embodiments, a case in which a three-phase inverter device is applied as a multi-phase power conversion device was described, the present invention is not limited to the case, and the present invention may be applied to a multi-phase inverter and a multi-phase converter having four or more phases.

REFERENCE SIGNS LIST

1 Inverter device
SA1, SA2, SA3 Switching arm
11, 13, 15 Lower arm (X-phase, Y-phase, Z-phase) IGBT
12, 14, 16 Upper arm (U-phase, V-phase, W-phase) IGBT
17 Current detecting IGBT of IGBT 11
21 Driving current supply circuit
22 Current detection unit
23 Overcurrent detection unit
24 Multi-phase overcurrent state detection unit
25 Overcurrent state control unit
26 P-channel field effect transistor
27 N-channel field effect transistor
28 OR circuit
30 DC control voltage source
31, 32, 33 Terminal
41, 42 Resistor
51 Comparator
52a, 52b, 53c, 52d, 707 AND circuit
54 Delay circuit
53, 62 OR circuit
69 Logic inversion circuit
59 First reference voltage source (voltage Vb1)
61 Short-circuiting switch element
65 Operational amplifier
66 Second reference voltage source (voltage Vb2)
111, 113, 115 Driver circuit

The invention claimed is:

1. A multi-phase power conversion device control circuit, comprising:
switching element driver circuits configured to respectively drive switching elements that are disposed for multiple phases, respectively,
each of the switching element driver circuits including
a driving current supply circuit configured to, when the corresponding switching element is brought to an operating state, supply a control terminal of the switching element with a source current and, when the switching element is brought to a non-operating state, supply the control terminal with a sink current;
a current detection circuit configured to detect a current flowing through the switching element as a voltage value;
an overcurrent detection circuit configured to, when the voltage value detected by the current detection circuit is higher than a first reference voltage, output an individual overcurrent detection signal; and
an overcurrent state control circuit configured to, when overcurrent detection circuits of the switching element driver circuits of at least two or more phases output individual overcurrent detection signals, output a multi-phase overcurrent signal and short-circuit the control terminal of the switching element to a low potential side terminal.

2. The multi-phase power conversion device control circuit according to claim 1, wherein each of the switching element driver circuits includes:
a terminal configured to output the individual overcurrent detection signal; and
a terminal configured to input another individual overcurrent detection signal output from another switching element driver circuit of the switching element driver circuits.

3. The multi-phase power conversion device control circuit according to claim 1, wherein
the switching element driver circuit includes an operational amplifier that includes
an inverting input terminal to which a voltage is input, the voltage is a detected voltage of a control terminal of the switching element,
a non-inverting input terminal to which a second reference voltage is input, and
an output terminal that is connected to the control terminal of the switching element, and
when the individual overcurrent detection signal is output and the multi-phase overcurrent signal is not output inside the switching element driver circuit, the operational amplifier is brought to an operating state.

4. The multi-phase power conversion device control circuit according to claim 1, wherein
the switching element driver circuit further includes a multi-phase overcurrent state detection circuit that receives the individual overcurrent detection signals of the respective phases and, when two or more individual overcurrent detection signals are in an ON state, outputs the multi-phase overcurrent signal, and
the overcurrent state control circuit includes a short-circuiting switch element that is connected between the control terminal of the switching element and a low potential side terminal and the multi-phase overcurrent signal is input to a control terminal of the short-circuiting switch element.

5. The multi-phase power conversion device control circuit according to claim 4, wherein
the multi-phase overcurrent state detection circuit includes
a plurality of logical product circuits to each of which two different individual overcurrent detection signals out of the respective individual overcurrent detection signals are input, and
a logical sum circuit to which outputs from the respective logical product circuits are input and outputs the multi-phase overcurrent signal from the logical sum circuit.

6. The multi-phase power conversion device control circuit according to claim 4, wherein
the multi-phase overcurrent state detection circuit includes a logical product circuit to which all the individual overcurrent detection signals are input and outputs the multi-phase overcurrent signal from the logical product circuit.

7. The multi-phase power conversion device control circuit according to claim 1, wherein
the switching elements of the power conversion device are voltage-controlled semiconductor devices.

8. A multi-phase power conversion device control circuit, comprising:
switching element driver circuits configured to respectively drive switching elements that switch a DC current to convert the DC current to multi-phase currents, respectively, each of the switching element driver circuits including
  a driving current supply circuit configured to, when the corresponding switching element is brought to an operating state, supply a control terminal of the switching element with a source current and, when the switching element is brought to a non-operating state, supply the control terminal with a sink current;
  a current detection circuit configured to detect a current flowing through the switching element as a voltage value;
  an overcurrent detection circuit configured to, when the voltage value detected by the current detection circuit is higher than a first reference voltage, output an individual overcurrent detection signal; and
  an overcurrent state control circuit configured to, when overcurrent detection circuits of the switching element driver circuits of at least two or more phases output individual overcurrent detection signals, output a multi-phase overcurrent signal and short-circuit the control terminal of the switching element to a low potential side terminal.

9. A multi-phase power conversion device control circuit, comprising:
  switching element driver circuits configured to respectively drive switching elements that are disposed for multiple phases, respectively,
  each of the switching element driver circuits including
    a driving current supply circuit configured to, when the corresponding switching element is brought to an operating state, supply a control terminal of the switching element with a source current and, when the switching element is brought to a non-operating state, supply the control terminal with a sink current;
    a current detection circuit including a current detecting switch, the current detecting switch having a gate and a collector connected, respectively, to the control terminal and a collector of the switching element, the current detecting circuit being configured to detect a current flowing through the switching element as a voltage value by conducting another current through the current detecting switch to a current input terminal, another current being proportional to the current flowing through the switching element;
    an overcurrent detection circuit configured to, when the voltage value detected by the current detection circuit is higher than a first reference voltage, output an individual overcurrent detection signal; and
    an overcurrent state control circuit configured to, when overcurrent detection circuits of the switching element driver circuits of at least two or more phases output individual overcurrent detection signals, output a multi-phase overcurrent signal and short-circuit the control terminal of the switching element to a low potential side terminal.

10. The multi-phase power conversion device control circuit according to claim 9, wherein the current detection circuit further includes series resistors that voltage divide another current to thereby output a voltage corresponding the voltage value at a connection point between resistors among the series resistors.

* * * * *

UNITED STATES PATENT AND TRADEMARK OFFICE
CERTIFICATE OF CORRECTION

PATENT NO.        : 10,141,834 B2
APPLICATION NO.   : 15/689790
DATED             : November 27, 2018
INVENTOR(S)       : Akira Nakamori Page 1 of 1

It is certified that error appears in the above-identified patent and that said Letters Patent is hereby corrected as shown below:

In the Claims

Column 14, Line 11:
In Claim 9, before "another" insert -- the --.

Column 14, Line 27:
In Claim 10, before "another" insert -- the --.

Signed and Sealed this
Twenty-ninth Day of January, 2019

Andrei Iancu
*Director of the United States Patent and Trademark Office*